(12) United States Patent
Chen et al.

(10) Patent No.: US 11,271,371 B2
(45) Date of Patent: Mar. 8, 2022

(54) LIGHT EMITTING DEVICE AND LIGHT EMITTING MODULE

(71) Applicant: Lextar Electronics Corporation, Hsinchu (TW)

(72) Inventors: Ting-Kai Chen, Hsinchu (TW); Lung-Kuan Lai, Hsinchu (TW); Jian-Chin Liang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 50 days.

(21) Appl. No.: 16/984,176

(22) Filed: Aug. 4, 2020

(65) Prior Publication Data

US 2021/0210931 A1  Jul. 8, 2021

(30) Foreign Application Priority Data

Jan. 2, 2020  (CN) .......................... 202010002542.8

(51) Int. Cl.
*H01S 5/40* (2006.01)
*H01S 5/02255* (2021.01)
*H01S 5/02257* (2021.01)

(52) U.S. Cl.
CPC ........ *H01S 5/4031* (2013.01); *H01S 5/02255* (2021.01); *H01S 5/02257* (2021.01)

(58) Field of Classification Search
CPC .............................. H01S 5/02255; H01S 5/40
USPC ...................................................... 372/50.12
See application file for complete search history.

(56) References Cited

U.S. PATENT DOCUMENTS

| 4,881,237 | A | * | 11/1989 | Donnelly | ............... | H01S 5/0233 372/50.12 |
|---|---|---|---|---|---|---|
| 5,081,637 | A | | 1/1992 | Fan et al. | | |
| 5,144,616 | A | | 9/1992 | Yasukawa et al. | | |
| 5,369,661 | A | | 11/1994 | Yamaguchi et al. | | |
| 5,465,265 | A | | 11/1995 | Ota | | |
| 6,151,168 | A | | 11/2000 | Goering et al. | | |
| 6,910,780 | B2 | | 6/2005 | Vail et al. | | |
| 6,995,912 | B2 | | 2/2006 | Okazaki et al. | | |
| 7,046,711 | B2 | | 5/2006 | Kopf et al. | | |
| 7,230,968 | B2 | | 6/2007 | Imai et al. | | |

(Continued)

FOREIGN PATENT DOCUMENTS

| DE | 102017107821 A1 | 10/2018 |
|---|---|---|
| JP | H07112084 B2 | 11/1995 |

(Continued)

*Primary Examiner* — Tuan N Nguyen
(74) *Attorney, Agent, or Firm* — CKC & Partners Co., LLC

(57) ABSTRACT

A light emitting device includes an edge emitting laser chip and a reflecting mirror. The edge emitting laser chip has light emitting ports arranged in parallel in a first direction. The light emitting ports emit light beams in a second direction. The reflecting mirror includes a reflecting surface used to reflect the light beams to a third direction. The first, second and third direction are perpendicular to each other. The light beams are emitted to the reflecting surface through the virtual incident plane and project first light spots on the reflecting surface. Each projected light spot has a first axis length in the first direction and a third axis length in the third direction. An interval between two immediately-adjacent light emitting ports is greater than the first axis length of one of the two projected light spots aligned with the two immediately-adjacent light emitting ports.

13 Claims, 9 Drawing Sheets

(56) References Cited

U.S. PATENT DOCUMENTS

| | | | |
|---|---|---|---|
| 7,468,999 B2 | 12/2008 | Konig et al. | |
| 8,477,824 B2 | 7/2013 | Zheng et al. | |
| 8,891,579 B1 * | 11/2014 | Price | H01S 5/40 372/107 |
| 9,705,289 B2 | 7/2017 | Kanskar et al. | |
| 9,748,733 B2 * | 8/2017 | Okahisa | H01S 5/02255 |
| 9,869,453 B2 | 1/2018 | Samonji et al. | |
| 10,122,146 B2 | 11/2018 | Hazeghi | |
| 2008/0025353 A1 * | 1/2008 | Govorkov | H01S 5/4062 372/29.022 |
| 2015/0049779 A1 | 2/2015 | Kontani | |
| 2017/0201067 A1 | 7/2017 | Shchukin et al. | |
| 2019/0265495 A1 | 8/2019 | Kobayashi et al. | |

FOREIGN PATENT DOCUMENTS

| | | |
|---|---|---|
| JP | 4740221 B2 | 8/2011 |
| JP | 4927051 B2 | 5/2012 |
| JP | 5471239 B2 | 4/2014 |
| TW | 201728962 A | 8/2017 |

* cited by examiner

LIGHT EMITTING DEVICE AND LIGHT EMITTING MODULE

RELATED APPLICATIONS

This application claims priority to China Application Serial Number 202010002542.8, filed Jan. 2, 2020, which are herein incorporated by reference.

BACKGROUND

Technical Field

The present disclosure relates to a light emitting device and a light emitting module with the light emitting device.

Description of Related Art

Time of flight (TOF) technology identifies distance and collects signals using the principle of optical reflection mainly. In recent years, through time of flight measurement technology, three-dimensional image measurement, and face recognition for mobile phones and self-driving cars can be achieved. Mainstream time of flight technology is performed by the use of surface emitting lasers. However, the power of the surface emitting laser is too low, and the measurement distance and the wavelength reachable range are limited due to technical bottlenecks.

Some problems should be solved if a high-power edge emitting laser is used instead of a surface emitting laser. Light emitted by an edge emitting laser has a different light shape from a light shape of light emitted by a surface emitting laser. Since the edge emitting laser has a greater emission angle with respect to the surface emitting laser, light passing through the diffuser for surface emitting laser is likely to have uneven luminous intensity, resulting in uneven light shape, speckle effect, and an insufficient emission angle.

SUMMARY

In view of this, the present disclosure provides a light emitting device and a light emitting module, and the problems mentioned above can be solved.

One aspect of the present disclosure is related to a light emitting device. A light emitting device includes an edge emitting laser chip and a reflecting mirror. The edge emitting laser chip has a plurality of light emitting ports arranged in parallel in a first direction. The light emitting ports of the edge emitting laser chip emit a plurality of light beams in a second direction perpendicular to the first direction. The reflecting mirror includes a reflecting surface used to reflect the light beams to a third direction perpendicular to the first direction and the second direction. The reflecting surface has a width in the first direction and a height in the third direction. The width and the height of the reflecting surface define a virtual incident plane at a front end of the reflecting surface. The virtual incident plane is perpendicular to the second direction. The light beams are emitted to the reflecting surface through the virtual incident plane. The light beams project a plurality of first light spots on the reflecting surface. Each of the light beams project a projected light spot on the virtual incident plane. Each projected light spot has a first axis length in the first direction and a third axis length in the third direction. An interval between two immediately-adjacent ones of the light emitting ports is greater than the first axis length of one of the two projected light spots that are at least partially aligned with the two immediately-adjacent ones of the light emitting ports.

In one or more embodiments, the first light spots do not exceed a boundary of the reflecting surface.

In one or more embodiments, the intervals between any two immediately-adjacent ones of the light emitting ports are equal.

In one or more embodiments, the intervals between any two immediately-adjacent ones of the light emitting ports are different.

In one or more embodiments, the projected light spots do not overlap each other on the virtual incident surface, and the first light spots do not overlap each other on the reflecting surface.

In one or more embodiments, a sum of the first axis lengths of the projected light spots and distances between the projected light spots is less than the width of the virtual incident plane.

In one or more embodiments, each third axis length is less than the height of the virtual incident surface.

One aspect of the present disclosure is related to a light emitting module. A light emitting module includes a light emitting device mentioned above and a diffuser. The diffuser faces the reflecting surface and is disposed along the third direction. The diffuser is used to receive the light beams reflected by the reflecting surface. The light beams reflected by the reflecting surface project a plurality of second light spots on the diffuser. The second light spots on the diffuser do not overlap each other.

In one or more embodiments, each second light spots has a first axis length along the first direction. The number of the second light spots is equal to the number of the first light spots. A sum of the first axis length of the second light spots and intervals between the second light spot is less than a length of the diffuser in the first direction.

In one or more embodiments, the light emitting module comprises a base and a housing. The base and the housing are combined to form a holding space. The light emitting device is configured in the holding space, the housing comprises a illuminating outlet. The diffuser is configured at the illuminating outlet of the housing.

In some embodiments, the illuminating outlet comprises a first illuminating outlet and a second illuminating outlet. The first illuminating outlet is located between the holding space and the second illuminating outlet. A width of the first illuminating outlet is less than a width of the second illuminating outlet.

In some embodiments, the diffuser is at least partially located in the second illuminating outlets to cover the first illuminating outlet.

In some embodiments, the housing comprises a trench located on a bottom of the second illuminating outlet.

In summary, through the use of the edge emitting laser chip, the luminous efficiency of the light emitting device and the light emitting module is effectively improved. The multiple light beams of the edge emitting laser are incident on the reflecting surface of the reflecting mirror through the virtual incident plane, and the projected light spots of the light beams projected on the virtual incident plane do not overlap each other, which corresponds to that each light beam does not interfere with each other. Therefore, the problem of light uniformity is improved after the edge emitting laser replaces the insufficient-power surface emitting laser, which is beneficial to the subsequent acquisition of image information through the principle of optical reflection.

The above description is only used to explain the problems to be solved by the present disclosure, the technical means for solving the problems and the produced effects. The specific details of the present disclosure are described in detail in the following embodiments and related drawings.

BRIEF DESCRIPTION OF THE DRAWINGS

The drawings disclose one or more embodiments of the present disclosure and, together with the explanation in the description, serve to explain the principles of the present disclosure. Wherever possible, the same reference numbers will be used throughout the drawings to refer to the same or like elements in the embodiments. These drawings include.

DETAILED DESCRIPTION

The following embodiments are disclosed with accompanying diagrams for a detailed description. For illustration clarity, many details are explained in the following description. However, it should be understood that these details do not limit the present disclosure. That is, these details are not necessary in parts of embodiments of the present disclosure. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have their usual meaning as used in the field, in the context of the disclosure and in the context of the particular content unless particularly specified otherwise. Some terms used to describe the disclosure are discussed below or elsewhere in the specification to provide additional guidance related to the description of the disclosure to those in the art.

The phrases "first," "second," etc., are solely used to separate the descriptions of elements or operations with the same technical terms, and are not intended to convey a meaning of order or to limit the disclosure.

Additionally, the phrases "comprising," "includes," "provided," and the like, are all open-ended terms, i.e., meaning including but not limited to.

Further, as used herein, "a" and "the" can generally refer to one or more unless the context particularly specifies otherwise. It will be further understood that the phrases "comprising," "includes," "provided," and the like used herein indicate the stated characterization, region, integer, step, operation, element and/or component, and does not exclude additional one or more other characterizations, regions, integers, steps, operations, elements, components and/or groups thereof.

Figure 1:
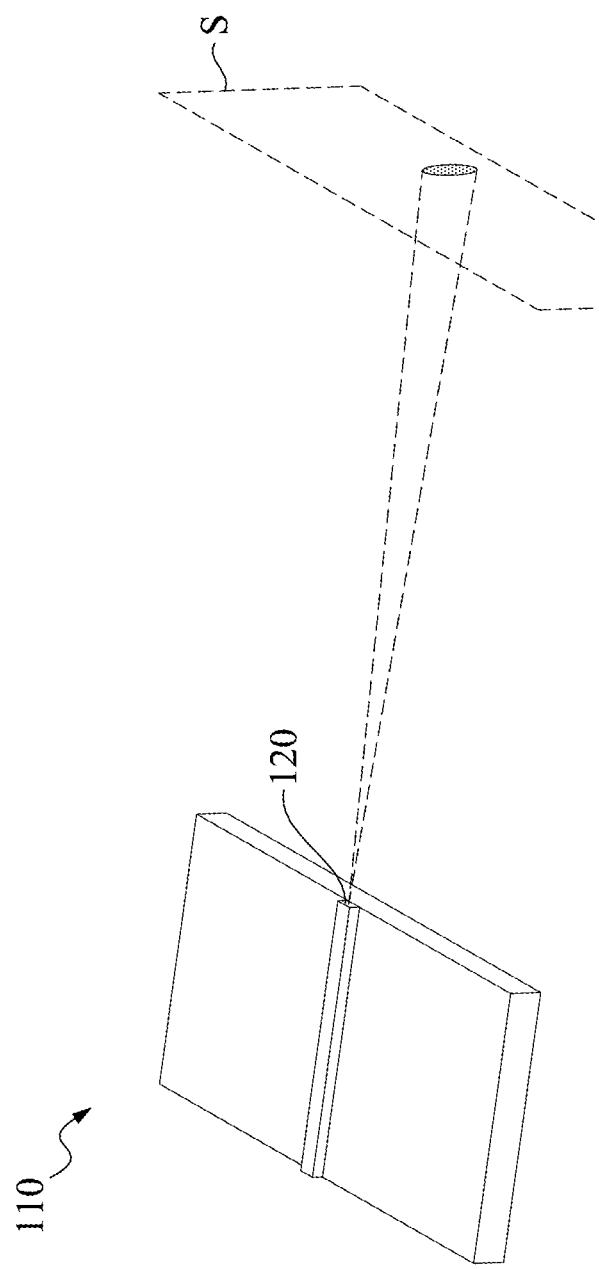
FIG. 1 illustrates a schematic diagram of an edge surface laser chip projecting a light beam to a plane.
Figure 2:
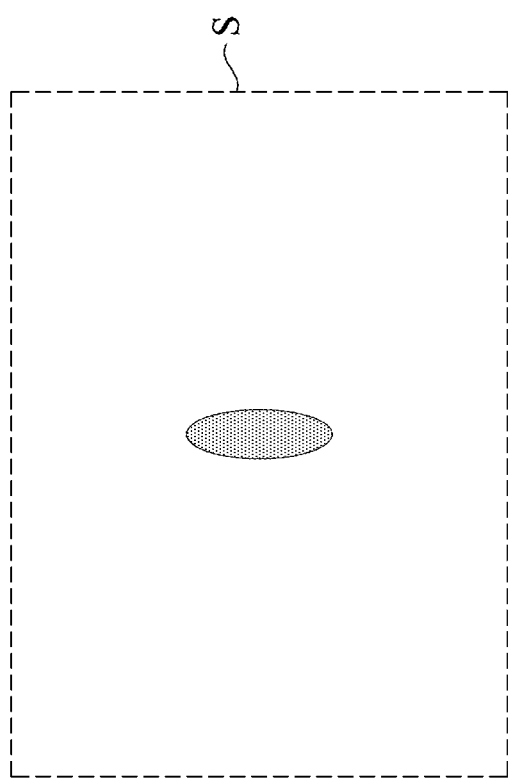
FIG. 2 illustrates a schematic diagram of a light shape of the light beam projected on the plane in FIG. 1.

Reference is made to FIGS. 1 and 2. FIG. 1 illustrates a schematic diagram of an edge surface laser chip 110 projecting a light beam through a single light emitting port 120 to a plane S. FIG. 2 illustrates a schematic diagram of a light shape of the light beam projected on the plane S in FIG. 1. Compared with the surface emitting laser, the edge emitting laser can have a higher luminous power. However, as shown in FIGS. 1 and 2, the light beam projected by the edge emitting laser chip 110 has an elongated and uneven light shape on the plane S, and the light shape of the light beam has a horizontal axis length and a vertical axis length. For example, in some embodiments, the horizontal axis length is less than the vertical axis length, and the horizontal axis length can be considered as a short axis length, and the vertical axis length can be considered as a long axis length. Therefore, the single beam projected by the edge emitting laser chip 110 cannot directly replace the original surface emitting laser.

At present, due to the thickness limitation, part of the edge emitting laser will have an excessively large emission angle in the vertical axis direction. In addition, there is currently no suitable diffuser for the edge emitting laser. Therefore, if the edge emitting laser replaces a surface emitting laser in consumer electronics products, the light beam from the edge emitting laser is likely to have uneven light intensity after passing through the diffuser, or develop a situation where the light emitting angle cannot be large enough.

In the present disclosure, a plurality of light beams is projected by edge emitting sources, and the elongated light beams are arranged in the longitudinal direction of the horizontal axis. Accordingly, in the longitudinal direction of the horizontal axis, the light shape composed of a plurality of elongated light beams is relatively similar to the light beam shape of light emitted by a surface emitting laser. The unevenness of the light shape of the light emitted by the edge emitting laser after passing through the diffuser and a corresponding resulting speckle effect can be improved, and the problem that the small emission angle of light from the edge emitting laser can be solved. For example, in some embodiments of the present disclosure, the horizontal axis length of the light beam is shorter than the vertical axis length, and the elongated beams from the edge emitting laser sources are arranged in the direction of the shorter horizontal axis length.

Figure 3:
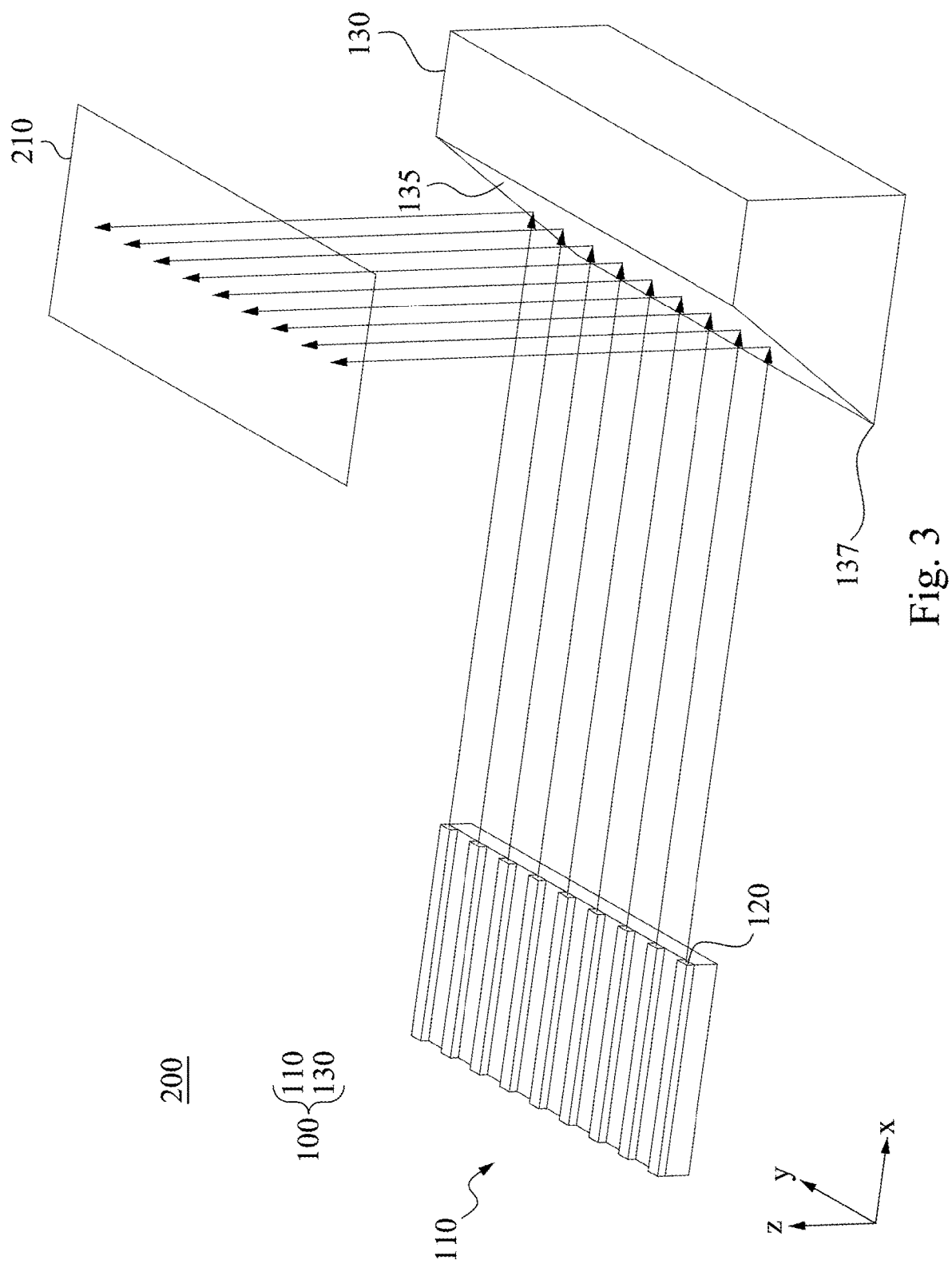
FIG. 3 illustrates a schematic diagram of a light emitting module according to one embodiment of the present disclosure.
Figure 4:
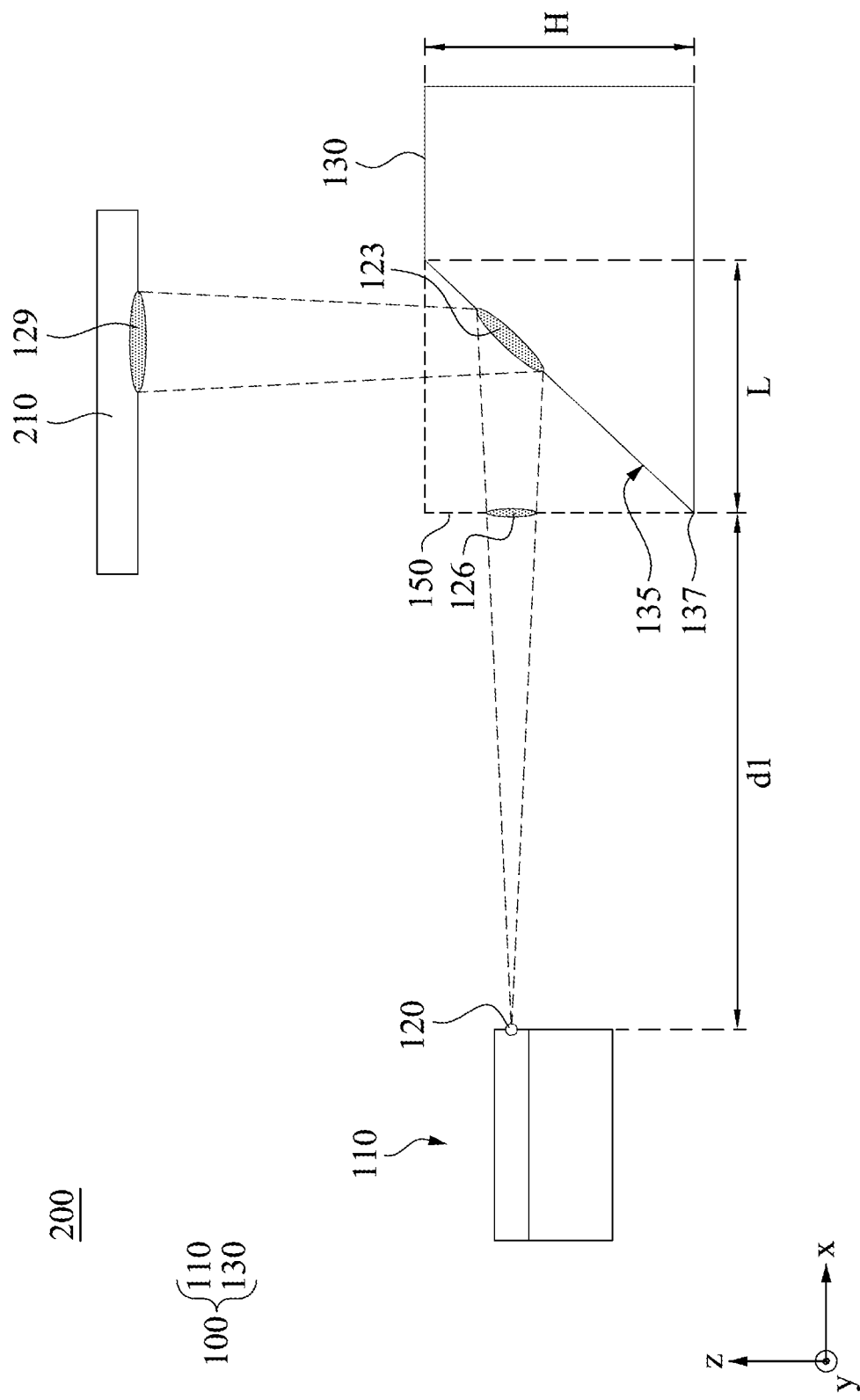
FIG. 4 illustrates a side view of the light emitting module of FIG. 3.

Reference is made to FIGS. 3 and 4. FIG. 3 illustrates a schematic diagram of a light emitting module 200 according to one embodiment of the present disclosure. FIG. 4 illustrates a side view of the light emitting module 200 of FIG. 3. Three directions are shown in FIGS. 3 and 4. The three directions are a first axis direction, a second axis direction and a third axis direction, and the three directions are perpendicular to each other. As shown in FIGS. 3 and 4, the x-axis is corresponding to the first direction, the y-axis is corresponding to the second direction, and z-axis is corresponding to the third direction. The x-axis, the y-axis and the z-axis are perpendicular to each other.

In this embodiment, the light emitting module 200 includes the light emitting device 100 and the diffuser 210. The light emitting device 100 includes an edge emitting laser chip 110 and a reflecting mirror 130. As shown in FIG. 3, the edge emitting laser chip 110 includes a plurality of light emitting ports 120. The light emitting ports 120 are arranged in parallel in the y-axis direction. When the light emitting module 200 operates, the light emitting ports 120 of the edge emitting laser chip 110 all project light beams to the reflecting mirror 130 in the x-axis direction. Through the reflecting surface 135 of the reflecting mirror 130, the light beams projected in the x-axis direction by the light emitting ports 120 are reflected in the z-axis direction to the diffuser 210 provided above the reflecting mirror 130.

Therefore, the traveling directions of the light beams from the light emitting ports 120 of the edge emitting laser chip 110 can be shown in FIG. 3. The light beams are respectively emitted in the x-axis direction from the light emitting ports 120 arranged in parallel, and the light beams are projected onto the reflecting surface 135. The light beams are reflected by the reflecting surface 135 and travel in the z-axis direction, and then the light beams are projected onto the diffuser 210. A side of the diffuser 210 faces the reflecting surface 135. The diffuser is configured along the z-axis direction to receive the light beam reflected from the reflecting surface 135. The diffuser 210 can diffuse the received light beam, so that a uniform surface light source can be formed on the diffuser 210. In some embodiments, a single reflecting mirror 130 is used to reflect all light beams from different light emitting ports 120 at a time.

Figure 6:
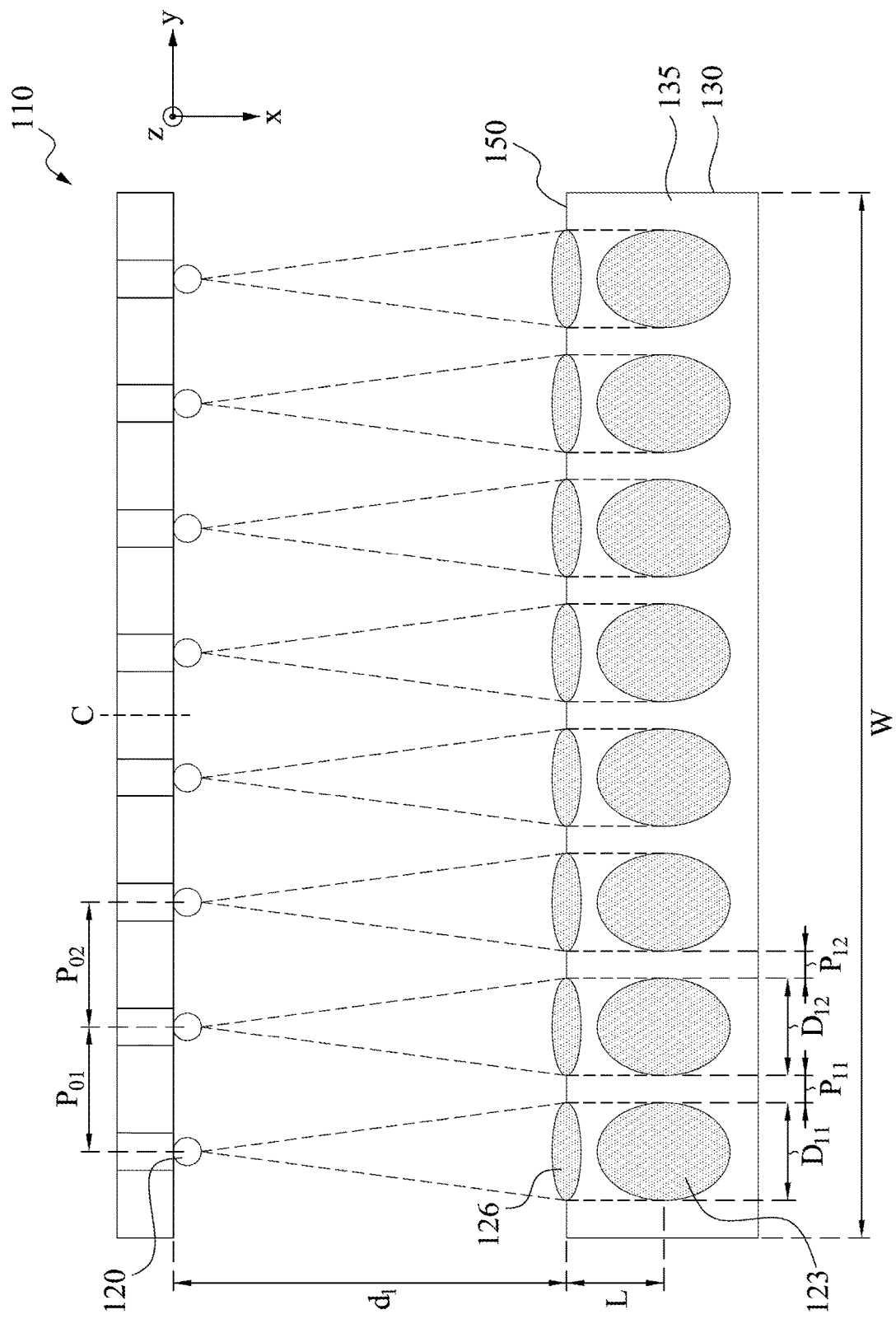
FIG. 6 illustrates a schematic diagram of first light spots projected on a reflecting surface of a reflecting mirror from light emitting ports of an edge emitting laser chip through a virtual incident plane in the light emitting module of the present disclosure.

In this embodiment, the light emitting ports 120 are arranged at equal intervals. In some embodiments, the light emitting ports 120 are arranged at unequal intervals. For example, with a center line of the edge emitting laser chip 110 (the center line C as shown in FIG. 6) as a reference, the light emitting ports 120 on both sides of the center line can be arranged symmetrically but at unequal intervals. The center line of the edge emitting laser chip 110 refers to a straight line between the two boundaries of the light port 120 arranged in parallel. For another example, part of the light emitting ports 120 are close to the center line and densely arranged, and part of the light emitting ports 120 are arranged far away from the center line and the interval decreases from the boundary toward the center along the y-axis direction. Conversely, the arrangement of the light emitting 120 close to the center line can be more distant, the arrangement of the light emitting 120 far from the center line can be denser, and the spacing increases from the boundary toward the center along the y-axis direction. In some embodiments, the interval changing for two immediately-adjacent the light emitting ports 120 can be asymmetrical. For example, it is a dense to sparse arrangement for the light emitting ports 120 arranged from a boundary of the edge emitting laser chip 110 to the center line of the edge emitting laser chip 110, and it is a sparse to dense arrangement for the light emitting ports 120 arranged from the center line to another boundary. In that case, the arrangement of the light emitting ports 120 is not symmetrical with respect to the center line.

The arrangement of the light emitting ports 120 is also related to the projected light beam. The light beam projected by each light emitting port 120 can have different y-axis length and z-axis length. For the relationship of the light beams and the intervals between the light emitting ports 120, please refer to the following discussion.

FIG. 4 illustrates a schematic side view of the light emitting module 200, and the projection of the light beams is illustrated. When the light emitting ports 120 of the edge emitting laser chip 110 projects a plurality of light beams in x-axis direction to the reflecting surface 135 of the reflecting mirror, a plurality of first light spots 123 are projected on the reflecting surface 135. By the reflection through the reflecting surface 135, the light beams from the light emitting ports 120 of the edge emitting laser chip 110 are reflected to the diffuser 210 in the z-axis direction, and a plurality of second light spots 129 are projected on the diffuser 210.

To avoid the light shapes of the light beams from the light emitting ports 120 of the edge emitting laser chip 110 overlapping each other resulting in interference between the light beams, in the present disclosure, a virtual incident plane 150 is used to further define the light beams Incident.

Figure 5:
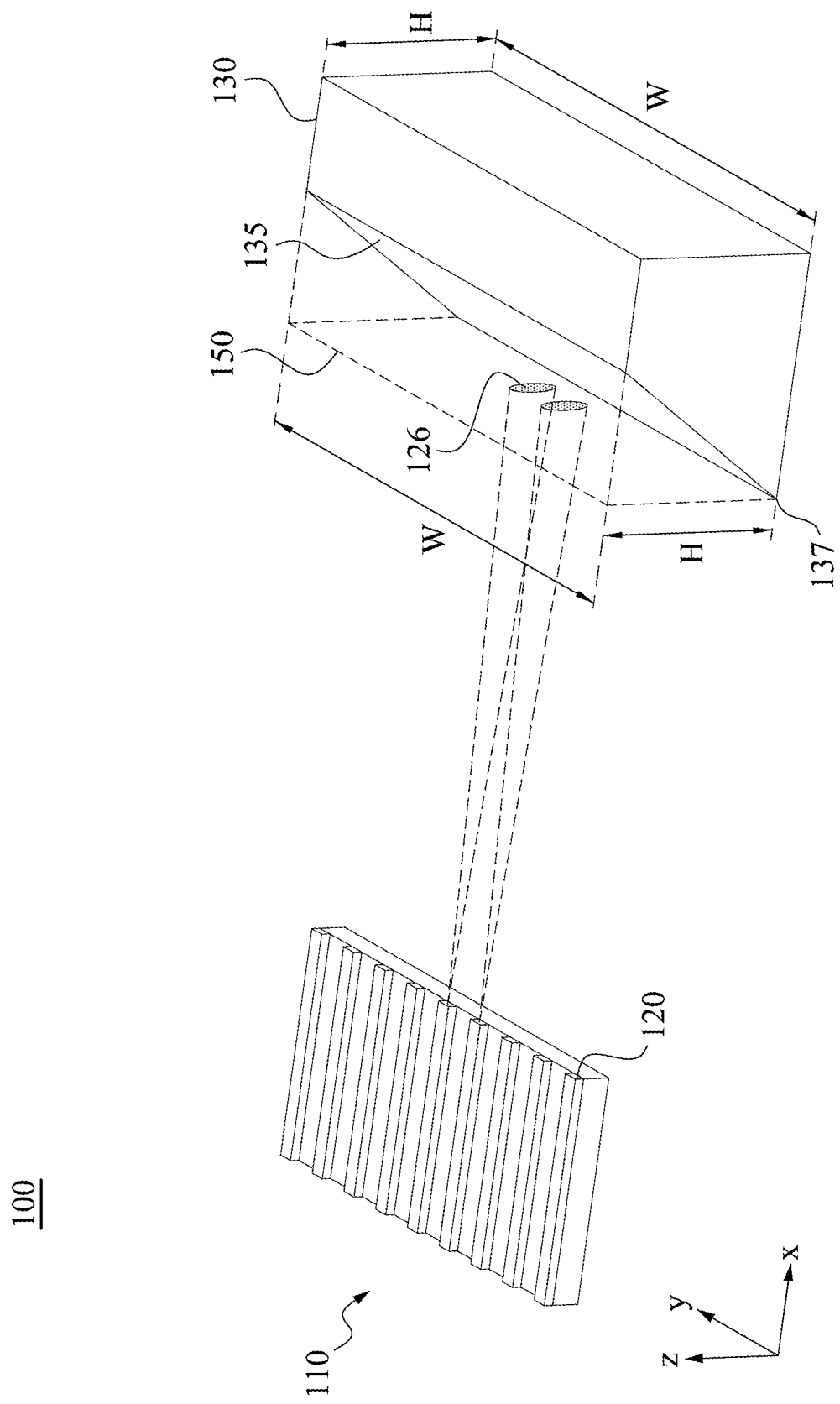
FIG. 5 illustrates a schematic diagram of a light emitting device according to one embodiment of the present disclosure.

Please refer to FIGS. 4 and 5. FIG. 4 illustrates a side view of the light emitting module 200, FIG. 5 illustrates a schematic diagram of a light emitting device 100 according to one embodiment of the present disclosure, and the configuration of the edge emitting laser chip 110 and the reflecting mirror 130 are illustrated. It should be noted that the light shape of the projected light spots 126 shown in FIG. 5 is only for illustration and used to explain the y-axis length of the projected light spots 126 (e.g., the y-axis lengths $D_{11}$ and $D_{12}$).

As shown in FIGS. 4 and 5, the reflecting surface 135 of the reflecting mirror 130 extends along the x-axis direction from the front end 137, and the reflecting surface 135 has a length L in the x-axis direction. The reflecting mirror 130 has a height H in the z-axis direction and a width W in the y-axis direction. An included angle between the reflecting surface 135 and the x-axis direction can be defined by the length L and the height H. In some embodiments, the included angle between the reflecting surface 135 and the x-axis direction is 45 degrees but does not limit to the present disclosure, and it facilitate the light beams to pass through the mirror center and be reflected in the z-axis direction.

A virtual incident surface 150 can be defined by the height H and the width W of the reflecting mirror 135. The virtual incident surface 150 is located at the front end 137 of the reflecting mirror 130 and extends along the z-axis direction. Therefore, the virtual incident surface 150 is perpendicular to the x-axis direction, and the virtual incident surface 150 has a height H and a width W. In other words, the virtual incident plane 150 can be a projection of the reflecting surface 135 on a plane formed by the x-axis direction and the z-axis direction. When the light emitting ports 120 project a plurality of light beams on the reflecting surface 135 in the x-axis direction, these light beams must pass through the virtual incident plane 150. The light beams can project a plurality of projected light spots 126 on the virtual incident plane 150 (x-z plane). If the first light spots 123 do not overlap with each other on the reflecting surface 135, the projected light spots 126 on the virtual incident plane 150 also do not overlap with each other, and the light beams do not interfere with each other. Accordingly, the virtual incident plane 150 can limit that the light beams do not overlap and interfere with each other.

As shown in FIG. 5, in this embodiment, the projected light spots 126 projected on the virtual incident plane 150 by the light beams projected from the light emitting ports 120 are with an elongated and uneven light shape. The projected light spots 126 are located on the virtual incident plane 150

(e.g. y-z plane) at the front end 137 of the reflecting mirror 130. Each projected light spots 126 has a y-axis length in the y-axis direction and a z-axis length in the z-axis direction. In this embodiment, for one of the projected light spots 126, the z-axis length is greater than the y-axis length. It can be considered that the vertical axis of the light beam is in the z-axis direction and the horizontal axis is in the y-axis direction. In this embodiment, the y-axis length of the projected light spots 126 is a short horizontal axis length, and the length of the z-axis of the projected light spots 126 is a long vertical axis length. In some embodiments, the horizontal axis length of the projected light spots 126 is less than the vertical axis length. It can be considered that the horizontal axis of the projected light spots 126 is the short axis and the vertical axis of the projected light spots 126 is the long axis.

Reference is made by FIGS. 5 and 6 to further illustrate the uneven light shape of the projected light spots 126. FIG. 6 illustrates a schematic diagram of first light spots 123 projected on the reflecting surface 135 of the reflecting mirror 130 from light emitting ports 120 of an edge emitting laser chip 110 through a virtual incident plane 150 in the light emitting module 200 of the present disclosure.

It should be noted that the light shape of the projected light spots 126 shown in FIG. 6 is only for illustration and used to explain the y-axis length of the projected light spots 126 (e.g., y-axis lengths $D_{11}$ and $D_{12}$). As shown in the figure, in this embodiment, two immediately-adjacent ones of the light emitting ports 120 have an interval (e.g., intervals $P_{01}$ and $P_{02}$). The light beams from the light emitting ports 120 are projected onto the reflecting surface 135 through the virtual incident plane 150. The light beams project a plurality of projected light spots 126 on the virtual incident plane 150. The projected light spots 126 have y-axis lengths on the y-axis (e.g., y-axis lengths $D_{11}$ and $D_{12}$). Two immediately-adjacent ones of the projected light spots 126 have an interval (e.g., intervals $P_{11}$ and $P_{12}$) there between. In this embodiment, the light shapes of the projected light spots 126 and the first light spots 123 are similar but do not limit the disclosure.

In the present disclosure, the interval between two immediately-adjacent light emitting ports 120 is greater than any y-axis length of the two projected light spots 126 corresponding to the two immediately-adjacent light emitting ports 120. In other words, the interval (e.g. $P_{01}$ or $P_{02}$) between two immediately-adjacent ones of the light emitting ports 120 is greater than the y-axis length of one of the two projected light spots 126 that are at least partially aligned with the two immediately-adjacent ones of the light emitting ports 120.

Specifically, as shown in FIG. 6, an interval $P_{01}$ between two immediately-adjacent light emitting ports 120 is close to the boundary, and the two immediately-adjacent light emitting ports 120 project two projected light spots 126 on the virtual incident plane 150 and respectively have two y-axis lengths $D_{11}$ and $D_{12}$. The two projected light spots 126 respectively having two y-axis lengths $D_{11}$ and $D_{12}$ are at least partially aligned with the two immediately-adjacent ones of the light emitting ports 120. In the present disclosure, the interval $P_{01}$ is greater than the y-axis length $D_{11}$, and the interval $P_{01}$ is also greater than the y-axis length $D_{12}$.

Accordingly, two immediately-adjacent projected light spots 126 do not overlap each other. It ensures that any two projected light spots 126 on the virtual incident plane 150 do not overlap. That is, any two first light spots 123 on the reflecting surface 135 would not overlap each other, and it ensures that the light beams do not interfere with each other.

As mentioned above, there is an interval between two immediately-adjacent light emitting ports 120, such as the interval $P_{01}$ and the interval $P_{02}$ shown in FIG. 6. In some embodiments, the interval $P_{01}$ and the interval $P_{02}$ are equal. In some embodiments, the interval $P_{01}$ and the interval $P_{02}$ are different. The interval $P_{01}$ is greater than the y-axis length $D_{11}$ and $D_{12}$. The interval $P_{02}$ is greater than the y-axis length $D_{12}$, indicating the y-axis length of different projected light spots 126 (e.g., the y-axis lengths $D_{11}$ and $D_{12}$) can be different from each other, and only need to satisfy the limited relationship about the interval between the two immediately-adjacent emitting light ports 120 (e.g., the interval $P_{01}$) and the y-axis length of the projected light spots 126 (e.g., y-axis length $D_{11}$, $D_{12}$). For example, the center line C of the edge emitting laser chip 110 is located in the middle of the two boundaries of the parallel arrangement of the light emitting ports 120, and the arrangement of the light emitting ports 120 from the center line C of the edge emitting laser chip 110 to the two boundaries is dense to sparse, the y-axis length corresponding of the projected light spot 126 on the virtual incident plane 150 can vary from short to long from the center outward.

Further, a sum of the y-axis lengths of the projected light spots 126 (e.g., y-axis length $D_{11}$ and $D_{12}$) and the intervals of two immediately-adjacent projected light spots 126 is less than the width W of the virtual incident plane 150. In addition, z-axis length of each projected light spot 126 is less than the height H of the virtual incident surface 150. Therefore, the projected light spots 126 do not overlap each other, and each projected light spot is located on the virtual incident plane. In other words, each first light spot 123 is located on the reflecting surface 135 and not beyond the boundary of the reflecting surface 135.

The light emission angles of the light beams in the z-axis direction can be defined by the distance $d_1$ between the light emitting ports 120 and the reflecting mirror 130 and the z-axis length of the projected light spots 126. The light emission angles of the light beams in the y-axis direction can be defined by the distance $d_1$ between the light emitting ports 120 and the reflecting mirror 130 and the y-axis length of the projected light spots 126. In some embodiments, the emission angle of the light beam in the y-axis direction is 30 degrees or less.

Figure 7:
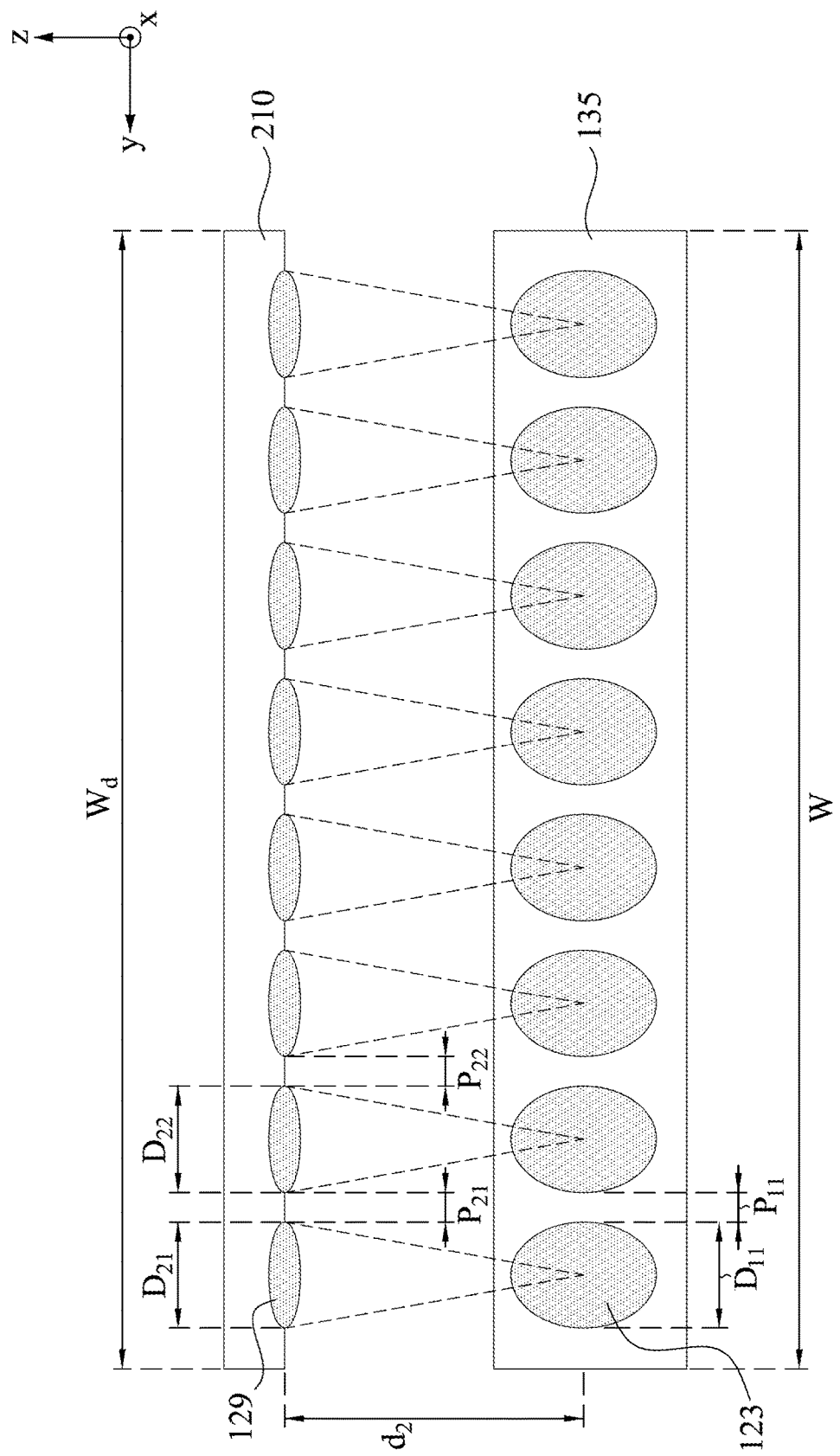
FIG. 7 illustrates a schematic diagram of light beams reflected from the reflecting surface of the reflecting mirror to a diffuser in a light emitting module of the present disclosure.

FIG. 6 illustrates how the light emitting port 120 of the edge emitting laser chip 110 are arranged so that the light beams projected from the light emitting port 120 do not interfere with each other. In FIG. 7, it is illustrated that how the diffuser 210 receives the light beam from the light emitting device 100 along the z-axis direction in the light emitting module 200.

FIG. 7 illustrates a schematic diagram of light beams reflected from the reflecting surface 135 of the reflecting mirror 130 to a diffuser 210 in a light emitting module 200 of the present disclosure.

FIG. 7 is a front view from the x-axis direction. As shown in the figure, the light beams projected from the light emitting ports 120 project the first light spots 123 on the reflecting surface 135. The light beams are reflected by the reflecting surface 135 and projected to the diffuser 210. Accordingly, the second light spots 129 are provided on the diffuser 210. A distance $d_2$ is regarded as a length from one of the first light spots 123 to the diffuser 210. Similarly, each of the second light spots 129 has a y-axis length in the y-axis direction (e.g., y-axis lengths $D_{21}$, $D_{22}$), and intervals are between two immediately-adjacent second light spots 129 (e.g., intervals $P_{21}$, $P_{22}$).

In this embodiment, the diffuser 210 is configured to prevent the second light spots 129 from overlapping each other. As shown in FIG. 7, the number of the first light spots 123 on the reflecting surface 135 is equal to the number of the second light spots 129, and a sum of the y-axis lengths of the second light spots 129 (e.g., the y-axis lengths $D_{21}$, $D_{22}$) and intervals between two immediately-adjacent second light spots 129 (e.g., intervals $P_{21}$ and $P_{22}$) is less than the length $W_d$ of the diffuser 210 in the y-axis direction.

In some embodiments, it merely requires that the second light spots 129 do not overlap each other for the light emitting module 200. Not all the second light spots 129 have to fall on the diffuser 210. Ensure that the second light spots 129 do not overlap with each other, that is, the reflected light beams do not interfere with each other. Therefore, with a suitable diffuser 210, a far field pattern with sufficient power and uniformity can be obtained, so as to facilitate subsequent signal acquisition through the principle of optical reflection.

Figure 8:
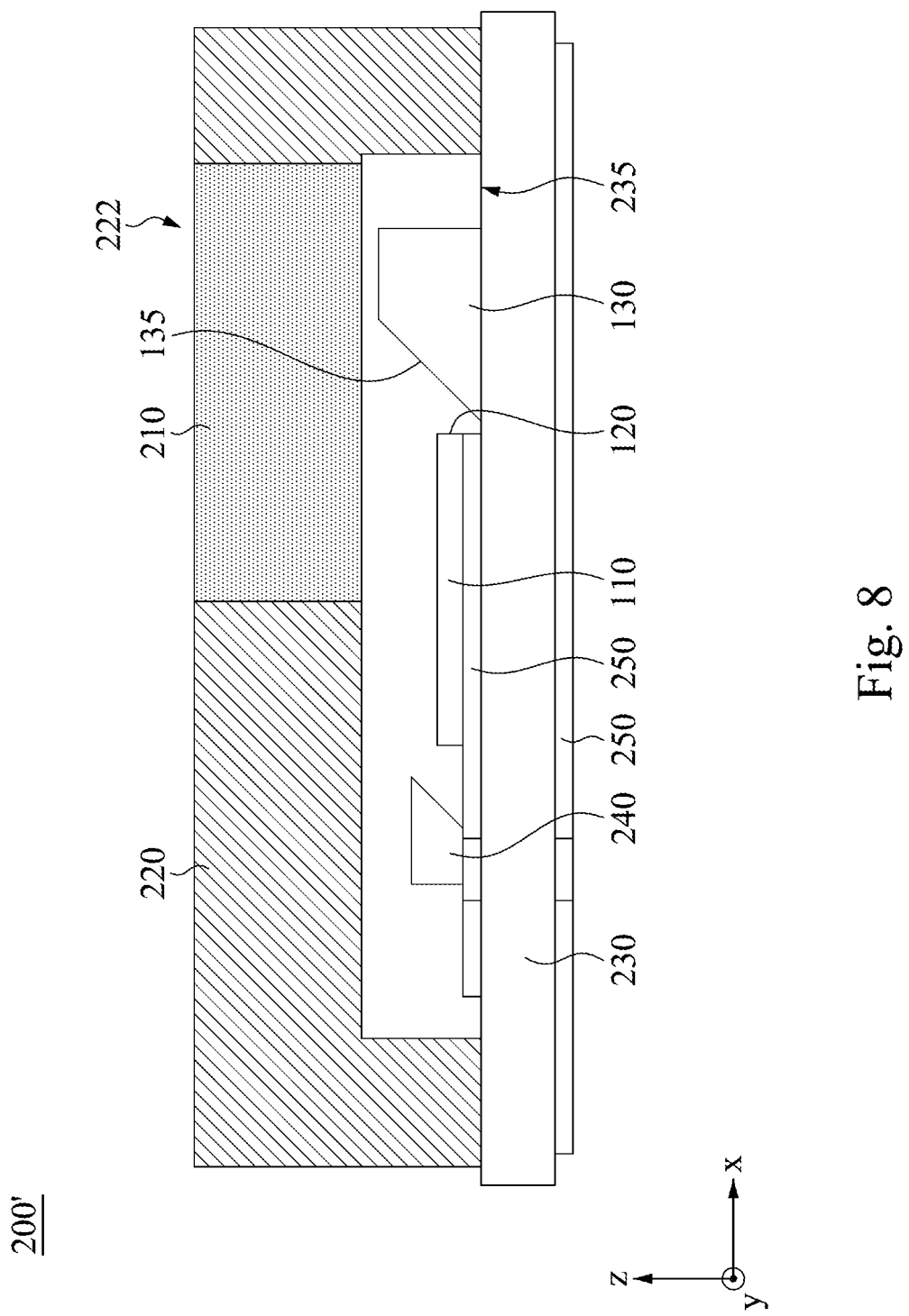
FIG. 8 illustrates a schematic diagram of a light emitting module according to another embodiment of the present disclosure.

FIG. 8 illustrates a schematic diagram of a light emitting module 200' according to another embodiment of the present disclosure. As shown in figure, the light emitting module 200' further includes a base 230 and a housing 220. The base 230 and the housing 220 form an accommodating space 235. The edge emitting laser chip 110 and the reflecting mirror 130 of the light emitting device 100 are located in the accommodating space 235. In some embodiments, the reflecting mirror 130 is aligned with the diffuser 210.

In some embodiments, the base 230 includes a printed circuit board, a metal substrate, a semiconductor substrate, a ceramic substrate, or the like. A conductive wire 250 is configured on the base 230 or at a bottom of the base 230 to take into account both electrical and thermal conductivity. In addition, in this embodiment, a photodetector 240 is also configured on the base 230, and an automatic power control (APC) function can be further established. The photodetector 240 is configured on a side of the edge emitting laser chip 110 opposite to the light emitting ports 120. In other words, the edge emitting laser chip 110 is located between the photodetector 240 and the reflecting mirror 130, and the light emitting ports 120 of the edge emitting laser chip 110 faces the reflecting mirror 135 to control the edge emitting laser chip 110 to project light beams with the same power. When the edge emitting laser chip 110 emits invisible light, the photodetector 240 can be used to confirm whether the edge emitting laser chip 110 is activated.

The housing 220 includes the illuminating outlet 222, and the diffuser 210 is configured at the illuminating outlet 222. As shown in FIG. 8, in this embodiment, the diffuser 210 is located inside the illuminating outlet 222. In some embodiments, the diffuser 210 can extend into the accommodating space 235 or out of the illuminating outlet 222, and the diffuser 210 can completely cover the illuminating outlet 222 in the accommodating space 235 and the outside of the housing 220. In some embodiment, the diffuser 210 is not located in the illuminating outlet 222, and the diffuser 210 can still cover the illuminating outlet 222. For example, the light outlet 222 is covered from outside the housing 220 or from the accommodating space 235. The combination mechanism of the diffuser 210 and the housing 220 can be a latch or an adhesive (through adhesive or metal).

Therefore, the light emitting ports 120 of the edge emitting laser chip 110 can project the light beams to the reflecting surface 135 of the reflecting mirror 130. The light beams are reflected to the diffuser 210 and passes through the illuminating outlet 220. The housing 220 can block light leakage. In some embodiments, the reflecting mirror 130 is substantially aligned with the diffuser 210, and the diffuser 210 can receive the light beam reflected from the reflecting surface 135 in a better way.

Figure 9:
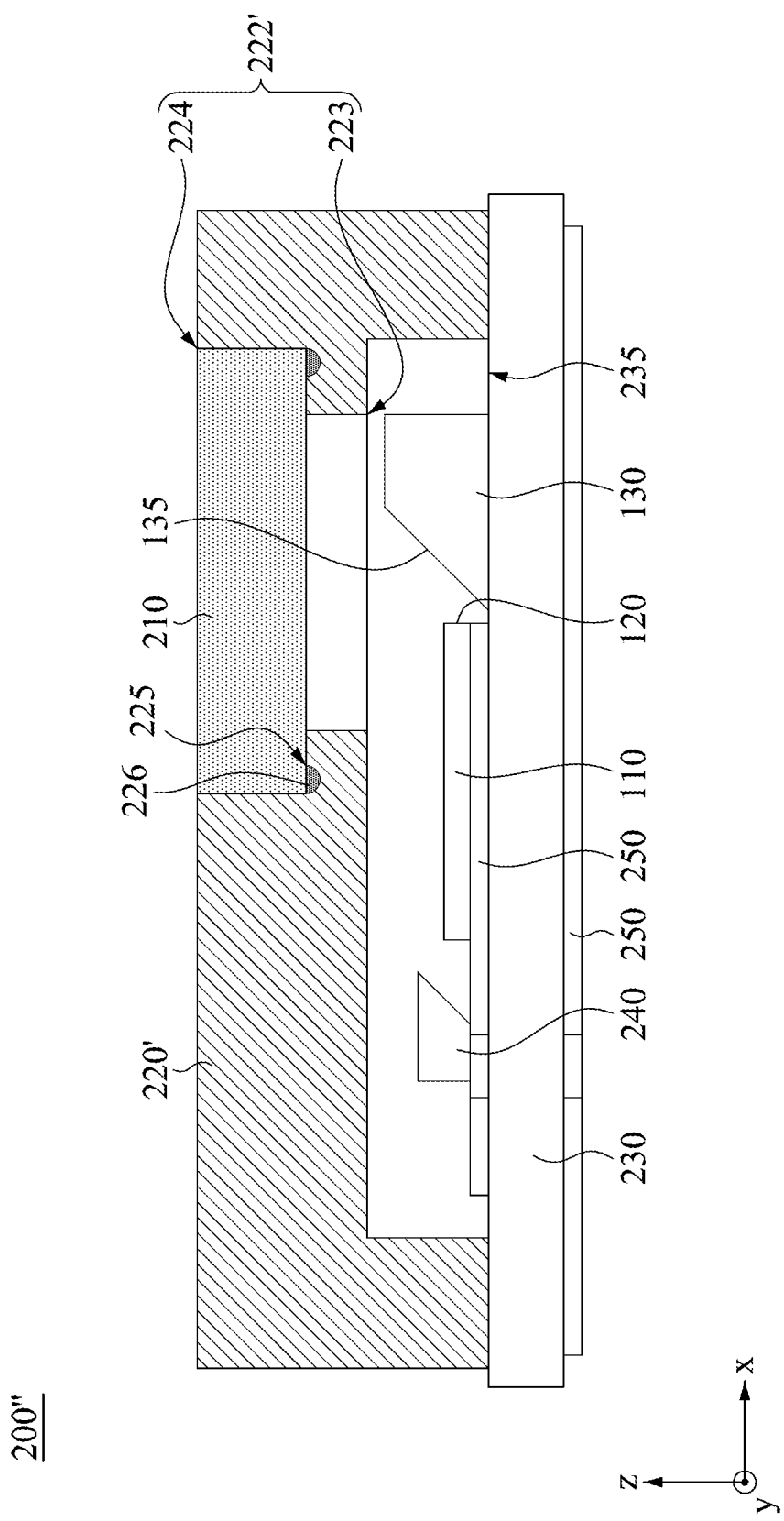
FIG. 9 illustrates a schematic diagram of a light emitting module according to another embodiment of the present disclosure.

FIG. 9 illustrates a schematic diagram of a light emitting module 200" according to another embodiment of the present disclosure. The difference between the light emitting module 200' of FIG. 8 and the light emitting module 200" is the configuration of the illuminating outlet 222' of the housing 220. As shown in FIG. 9, the illuminating outlet 222' includes a first illuminating outlet 223 and a second illuminating outlet 224. The second illuminating outlet 224 connected to external space. The first illuminating outlet 223 is located between the second illuminating outlet 224 and the accommodating space 235. A width of the first illuminating 223 is less than a width of the second illuminating outlet 224. Accordingly, the second illuminating outlet 224 can be a recess accommodating the diffuser 210, and the first illuminating outlet 223 is located at the bottom of the second illuminating outlet 224. The design of the first illuminating outlet 223 and the second illuminating outlet 224 with different widths can shield the excess light beam to further guide the light shape.

In FIG. 9, the diffuser 210 is embedded in the second illuminating outlet 224. In some embodiments, part of the diffuser 210 is located in the second illuminating outlet 224 to cover the first illuminating outlet 223. In this embodiment, a trench 225 is further included at the bottom of the second illuminating outlet 224. When the diffuser 210 is located in the second illuminating outlet 224 and is bonded to the second light outlet 224 through an adhesive 226, the trench 225 can guide the adhesive 226, so that the adhesive 226 flows into the trench 225 to avoid the adhesive 226 affects the edge of the diffuser 210 due to the capillary phenomenon. In some embodiments, the width of the trench 225 is less than half of the difference between the widths of the first illuminating outlet 223 and the second illuminating outlet 224.

In summary, the use of the edge emitting laser chip effectively improves the overall luminous power of the light emitting device and the light emitting module. The light beams of the edge emitting laser chip with light emitting ports enter the reflecting surface of the reflecting mirror through the virtual incident plane, and the projected spots of the light beams projected on the virtual incident plane do not overlap each other. Therefore, the light beams will not interfere with each other to solve the problem of light uniformity that occurs when the edge emitting laser replaces the insufficient-power surface emitting laser which is beneficial to the subsequent acquisition of image information through the principle of optical reflection. Further, the light emitting module can include a diffuser and a housing, and the design of the illuminating outlet of the housing can shield the excess light beam to guide the light shape generated by the light beams projected by the edge emitting laser.

The foregoing has described features of several embodiments so that those skilled in the art may better understand the description in various aspects. It will be apparent to those skilled in the art that various modifications and variations can be made to the structure of the embodiments of the present disclosure without departing from the scope or spirit of the present disclosure. In view of the foregoing, it is intended that the present disclosure cover modifications and variations, provided they fall within the scope of the following claims.

What is claimed is:

1. A light emitting device, comprising:
an edge emitting laser chip having a plurality of light emitting ports arranged in parallel in a first direction, wherein the light emitting ports of the edge emitting laser chip project a plurality of light beams in a second direction perpendicular to the first direction; and
a reflecting mirror comprising a reflecting surface used to reflect the light beams to a third direction perpendicular to the first direction and the second direction,
wherein the reflecting surface has a width in the first direction and a height in the third direction, the width and the height of the reflecting surface define a virtual incident plane at a front end of the reflecting surface, and the virtual incident plane is perpendicular to the second direction,
wherein the light beams are emitted to the reflecting surface through the virtual incident plane, the light beams project a plurality of first light spots on the reflecting surface, each of the light beams project a projected light spot on the virtual incident plane, each projected light spot has a first axis length in the first direction and a third axis length in the third direction, and an interval between two immediately-adjacent ones of the light emitting ports is greater than the first axis length of one of the two projected light spots that are at least partially aligned with the two immediately-adjacent ones of the light emitting ports.

2. The light emitting device of claim 1, wherein the first light spots do not exceed a boundary of the reflecting surface.

3. The light emitting device of claim 1, wherein the intervals between any two immediately-adjacent ones of the light emitting ports are equal.

4. The light emitting device of claim 1, wherein the intervals between any two immediately-adjacent ones of the light emitting ports are different.

5. The light emitting device of claim 1, wherein the projected light spots do not overlap each other on the virtual incident surface, and the first light spots do not overlap each other on the reflecting surface.

6. The light emitting device of claim 1, wherein a sum of the first axis lengths of the projected light spots and distances between the projected light spots is less than the width of the virtual incident plane.

7. The light emitting device of claim 1, wherein each third axis length is less than the height of the virtual incident surface.

8. A light emitting module, comprising:
the light emitting device of claim 1, and
a diffuser facing the reflecting surface and disposed along the third direction, wherein the diffuser is used to receive the light beams reflected by the reflecting surface, the light beams reflected by the reflecting surface project a plurality of second light spots on the diffuser, and the second light spots on the diffuser do not overlap each other.

9. The light emitting module of claim 8, wherein each second light spots has a first axis length along the first direction, the number of the second light spots is equal to the number of the first light spots, a sum of the first axis length of the second light spots and intervals between the second light spot is less than a length of the diffuser in the first direction.

10. The light emitting module of claim 8, wherein the light emitting module comprises a base and a housing, the base and the housing are combined to form a holding space, the light emitting device is configured in the holding space, the housing comprises a illuminating outlet, and the diffuser is configured at the illuminating outlet of the housing.

11. The light emitting module of claim 10, wherein the illuminating outlet comprises a first illuminating outlet and a second illuminating outlet, the first illuminating outlet is located between the holding space and the second illuminating outlet, and a width of the first illuminating outlet is less than a width of the second illuminating outlet.

12. The light emitting module of claim 11, wherein the diffuser is at least partially located in the second illuminating outlet to cover the first illuminating outlet.

13. The light emitting module of claim 11, wherein the housing comprises a trench located on a bottom of the second illuminating outlet.

* * * * *